United States Patent
Wu et al.

(10) Patent No.: US 11,798,904 B2
(45) Date of Patent: Oct. 24, 2023

(54) SEMICONDUCTOR STRUCTURE, REDISTRIBUTION LAYER (RDL) STRUCTURE, AND MANUFACTURING METHOD THEREOF

(71) Applicant: Changxin Memory Technologies, Inc., Anhui (CN)

(72) Inventors: Ping-Heng Wu, Hefei (CN); Wen Hao Hsu, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 256 days.

(21) Appl. No.: 17/233,172

(22) Filed: Apr. 16, 2021

(65) Prior Publication Data

US 2021/0242149 A1 Aug. 5, 2021

Related U.S. Application Data

(63) Continuation of application No. PCT/CN2019/119759, filed on Nov. 20, 2019.

(30) Foreign Application Priority Data

Nov. 20, 2018 (CN) .......................... 201811385525.6
Nov. 20, 2018 (CN) .......................... 201821951661.2

(51) Int. Cl.
*H01L 23/00* (2006.01)

(52) U.S. Cl.
CPC .............. *H01L 24/05* (2013.01); *H01L 24/03* (2013.01); *H01L 2224/0391* (2013.01);
(Continued)

(58) Field of Classification Search
CPC .................... H01L 24/05; H01L 24/03; H01L 2224/03614; H01L 2224/0391; H01L 2224/04042; H01L 2224/05008; H01L 2224/05012; H01L 2224/05013; H01L 2224/05015; H01L 2224/05019;
(Continued)

(56) References Cited

U.S. PATENT DOCUMENTS 8,581,404 B2 11/2013 Chou et al.
10,756,035 B2 * 8/2020 Roth ........................ H01L 24/03
(Continued)

FOREIGN PATENT DOCUMENTS

| CN | 1901161 A | 1/2007 |
| CN | 207852664 U | 9/2018 |
| CN | 209216954 U | 8/2019 |

OTHER PUBLICATIONS

PCT International Search Report and the Written Opinion dated Feb. 24, 2020, issued in related International Application No. PCT/CN2019/119759 (8 pages).

*Primary Examiner* — Douglas W Owens
(74) *Attorney, Agent, or Firm* — Sheppard Mullin Richter & Hampton LLP

(57) ABSTRACT

The present disclosure relates to a redistribution layer (RDL) structure, a manufacturing method thereof, and a semiconductor structure having the same. The RDL structure includes an RDL, disposed on a substrate, and including a bond pad portion and a wire portion connected to the bond pad portion, where a thickness of the bond pad portion is greater than a thickness of the wire portion.

21 Claims, 7 Drawing Sheets

(52) U.S. Cl.
CPC ............... *H01L 2224/03614* (2013.01); *H01L 2224/04042* (2013.01); *H01L 2224/05008* (2013.01); *H01L 2224/05012* (2013.01); *H01L 2224/05013* (2013.01); *H01L 2224/05015* (2013.01); *H01L 2224/05019* (2013.01); *H01L 2224/05124* (2013.01); *H01L 2224/05147* (2013.01); *H01L 2224/05166* (2013.01); *H01L 2224/05184* (2013.01); *H01L 2924/30105* (2013.01); *H01L 2924/3512* (2013.01)

(58) Field of Classification Search
CPC . H01L 2224/05124; H01L 2224/05147; H01L 2224/05166; H01L 2224/05184; H01L 2924/30105; H01L 2924/3512; H01L 24/45; H01L 24/48; H01L 2224/02313; H01L 2224/0235; H01L 2224/0239; H01L 2224/0345; H01L 2224/03462; H01L 2224/03612; H01L 2224/05548; H01L 2224/05552; H01L 2224/05553; H01L 2224/05555; H01L 2224/05556; H01L 2224/05624; H01L 2224/05647; H01L 2224/05666; H01L 2224/05684; H01L 2224/45144; H01L 2224/45147; H01L 2224/48463; H01L 23/5283; H01L 24/02; H01L 21/76885

See application file for complete search history.

(56) References Cited

U.S. PATENT DOCUMENTS

| | | | |
|---|---|---|---|
| 2002/0056741 | A1 | 5/2002 | Shieh et al. |
| 2005/0127530 | A1* | 6/2005 | Fan .................... H01L 24/03 |
| | | | 257/786 |
| 2008/0012132 | A1 | 1/2008 | Lin |
| 2008/0111230 | A1 | 5/2008 | Kim et al. |
| 2009/0224402 | A1 | 9/2009 | Do et al. |
| 2014/0346663 | A1* | 11/2014 | Chopin ................ H01L 24/48 |
| | | | 257/737 |
| 2016/0300804 | A1* | 10/2016 | Omori ............ H01L 21/76852 |
| 2017/0062361 | A1* | 3/2017 | Yajima ................. H01L 24/49 |
| 2017/0062362 | A1* | 3/2017 | Sekikawa ........... H01L 23/525 |
| 2017/0221843 | A1* | 8/2017 | Chang ................. H01L 24/48 |
| 2018/0006002 | A1* | 1/2018 | Tsai ..................... H01L 25/03 |
| 2022/0013481 | A1* | 1/2022 | Usami .................. H01L 24/03 |

* cited by examiner

SEMICONDUCTOR STRUCTURE, REDISTRIBUTION LAYER (RDL) STRUCTURE, AND MANUFACTURING METHOD THEREOF

CROSS-REFERENCE TO RELATED APPLICATIONS

This application is a continuation application of International Patent Application No. PCT/CN2019/119759, filed on Nov. 20, 2019, which is based on and claims priority to and benefits of the Chinese Patent Application Nos. 201811385525.6 and 201821951661.2, both filed with the State Intellectual Property Office (SIPO) of the People's Republic of China on Nov. 20, 2018. The entire contents of the above-referenced applications are incorporated herein by reference.

TECHNICAL FIELD

The present disclosure relates to the technical field of semiconductors, and in particular to a redistribution layer (RDL) structure, a semiconductor structure, and a manufacturing method thereof.

BACKGROUND

An RDL may reroute I/O pads of an original designed integrated circuit (IC) via a wafer-level metal distribution process and a micro bump process, so that the IC can be adapted for different packaging forms. The wafer-level metal distribution process may coat an insulating protective layer on the IC, then a new wire pattern may be defined by photolithography. A new metal circuit may be fabricated by an electro-plating technology, to connect the original aluminum bond pads to new micro bumps or copper bond pads for the circuit redistribution.

In the related art, during wire bonding gold/copper bond balls to aluminum bond pads of the RDL, the RDL aluminum bond pads having insufficient thickness are often squeezed outwards by the gold/copper bond balls from a center of the bond pads. The bond balls may directly impact a substrate to cause cracks or deformation of the substrate, and even circuit short and failure of the IC.

It is to be noted that the information disclosed in the above Background is merely for enhancing the understanding of the background of the present disclosure, and thus may include information not constituted as prior art known to a person of ordinary skill in the art.

SUMMARY

The present disclosure discloses an RDL structure providing more impact buffer areas in copper wire bonding of IC packaging.

One aspect of the present disclosure may be directed to a wiring layer (WL) structure. The WL structure may comprise a WL, disposed on a substrate, and comprising a bond pad portion and a wire portion connected to the bond pad portion, wherein a thickness of the bond pad portion is greater than a thickness of the wire portion. The WL may comprise a redistribution layer (RDL), and the WL structure may comprise an RDL structure.

In an exemplary embodiment of the present disclosure, the bond pad portion may comprise a bond pad body portion and a bond portion disposed on a surface of the bond pad body portion facing away from the substrate.

In an exemplary embodiment of the present disclosure, the bond pad portion formed by the bond pad body portion and the bond portion may be of a step shape, and a length and a width of the bond pad body portion may be greater than a length and a width of an orthographic projection of the bond portion on the bond pad body portion, respectively.

In an exemplary embodiment of the present disclosure, a preset distance may be provided between side edges of the bond portion and side edges of the bond pad body portion, and the preset distance may range from 0.5 μm to 3 μm.

In an exemplary embodiment of the present disclosure, the thickness of the wire portion may be the same as the thickness of the bond pad body portion.

In an exemplary embodiment of the present disclosure, a thickness difference between the bond pad portion and the wire portion may range from 1 μm to 2.5 μm.

In an exemplary embodiment of the present disclosure, the orthographic projection of the bond portion and the orthographic projection of the bond pad body portion may be of a rectangular shape, a hexagonal shape, an octagonal shape, a circular shape, or an oval shape, and the shapes of the orthographic projections of the bond pad body portion and the bond portion may be the same or different.

In an exemplary embodiment of the present disclosure, a cross-section view of the bond portion and a cross-section view of the bond pad body portion may be of the rectangular shape or a trapezoidal shape, and the shapes of the cross-section view of the bond portion and the cross-section view of the bond pad body portion may be the same or different.

In an exemplary embodiment of the present disclosure, the trapezoidal shaped cross-section view of the bond portion and the trapezoidal shaped cross-section view of the bond pad body portion may comprise a top, a bottom, and sides, wherein the top is a surface facing away from the substrate, and an area of the top is smaller than an area of the bottom.

In an exemplary embodiment of the present disclosure, the bond portion and the bond pad body portion may be made of the same material, the bond portion and the bond pad body portion are of an integral structure.

In an exemplary embodiment of the present disclosure, the wire portion and the bond pad body portion may be made of the same material, and the wire portion and the bond pad body portion are of an integral structure.

In an exemplary embodiment of the present disclosure, the RDL structure may further include a protective layer disposed on surfaces of the RDL facing away from the substrate. The protective layer and the passivation layer may have openings to expose the top surface of the bond portion away from the substrate. The top surface of the protective layer away from the substrate may be protruded out of the top surface of the bond portion away from the substrate.

In an exemplary embodiment of the present disclosure, the RDL structure may further include a passivation layer disposed on the surfaces of the RDL facing away from the substrate, the passivation layer is flush with the top surface of the bond portion facing away from the substrate. The protective layer disposed on a surface of the passivation layer facing away from the substrate.

Another aspect of the present disclosure may be directed to a manufacturing method of an RDL structure. The method may include providing a substrate, and forming an RDL on the substrate. The RDL may comprise a bond pad portion and a wire portion connected to the bond pad portion, and a thickness of the bond pad portion is greater than a thickness of the wire portion.

In an exemplary embodiment of the present disclosure, the manufacturing method may further include forming a metal layer on the substrate, forming a first photoresist layer, matched with the bond pad portion, on a side of the metal layer away from the substrate, etching an area of the metal layer not covered by the first photoresist layer, wherein a thickness of the metal layer at the bond pad portion is greater than thicknesses of other areas, forming a second photoresist layer with a preset pattern on the surface of the metal layer away from the substrate, and etching an area of the metal layer not covered by the second photoresist layer, wherein the bond pad portion and the wire portion are formed from the metal layer.

In an exemplary embodiment of the present disclosure, the manufacturing method may further include forming a protective layer on a surface of the RDL away from the substrate, and etching the protective layer to expose the bond portion from the passivation layer.

In an exemplary embodiment of the present disclosure, the manufacturing method further includes forming a passivation layer on the surface of the RDL away from the substrate, wherein the passivation layer is flush with the top surface of the bond portion, and forming the protective layer on a surface of the passivation layer away from the substrate.

Another aspect of the present disclosure is directed to a semiconductor structure, including the above-mentioned RDL structure.

The RDL structure provided by the present disclosure prevents the problem of an increase of parasitic capacitances among wires when a thickness of an RDL is increased. In the RDL structure provided by the present disclosure, a thicker bond pad portion than a wire portion can provide more impact buffer areas in gold or copper wire bonding of packaging, so that the situation that an insulating layer of a substrate is broken under stress or a circuit short caused by that a bottom metal lead wire of the bond pad portion is deform under stress may be prevented. The thinner wire portion than the bond pad portion may reduce a parasitic capacitance effect between wires, so that the performance of an IC is improved to meet a high-frequency working requirement.

It is to be understood that both the foregoing general description and the following detailed description are exemplary and explanatory only and are not necessarily restrictive to the present disclosure.

BRIEF DESCRIPTION OF DRAWINGS

The accompanying drawings, which are incorporated in and constitute a part of the specification, illustrate embodiments of the present disclosure and together with the specification, serve to explain the principles of the present disclosure. Apparently, the accompanying drawings in the following description are only a portion of embodiments of the present disclosure, and a person of ordinary skill in the art can derive other drawings from the accompanying drawings without creative efforts.

DESCRIPTION OF EMBODIMENTS

Figure 1:
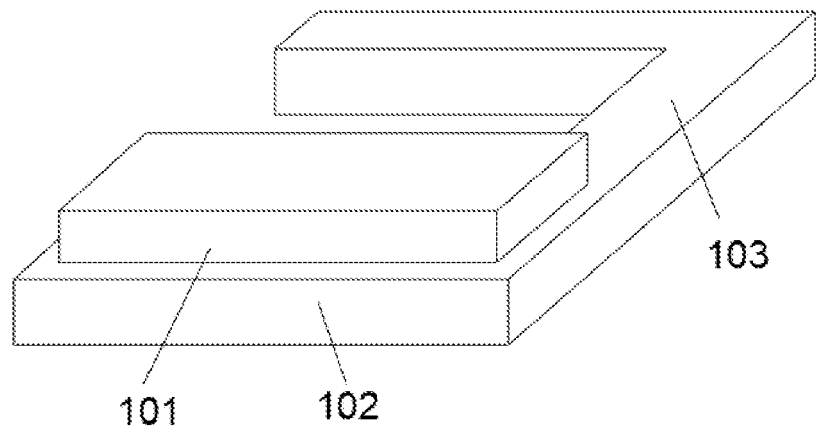
FIG. 1 is a schematic diagram of an RDL structure in an embodiment of the present disclosure.

The exemplary embodiments will be described more completely in conjunction with the accompanying drawings. However, the exemplary embodiments can be implemented in various forms, and should not be understood as being limited to the embodiments described herein. Instead, these embodiments are provided to make the present disclosure thorough and complete, and fully convey the concepts of the exemplary embodiments to a person skilled in the art. Identical numerals in the drawings represent an identical or similar structure and thus the detailed descriptions thereof are omitted.

Although relative terms are used in the specification, for example, "on" and "under" are used to describe a relative relationship of one numeral component to another component, these terms used in the specification are merely for the convenience, for instance, according to an exemplary direction in the drawings. It is to be understood that if a numeral apparatus is reversed, such as to turn upside down, a component described to be "on" will become a component to be "under". When a structure is "on" other structure, it may be indicated that the structure is integrally formed on the other structure, or indicated that the structure is "directly" disposed on the other structure, or indicated that the structure is "indirectly" disposed on the other structure via another structure.

Terms "a", "an", "one", "the", "said," and "at least one" are used to represent one or more elements/compositional portions/and the like. Terms "include", "including", "comprise", "comprising", "has", and "having" are used to represent a meaning of open inclusion and refer to that another elements/compositional portions/and the like may further be present besides the listed elements/compositional portions/and the like. The terms "first", "second", "third", and the like are merely used as numerals rather than limits to the number of objects thereof.

In the related art, when manufacturing an aluminum RDL for copper wire bonding, RDL aluminum bond pads with insufficient thickness are often squeezed outwards by copper bond balls from centers of the bond pads, and the copper bond balls may directly impact a substrate to cause cracks or deformation of the substrate and even circuit short and failure of an IC.

Figure 2:
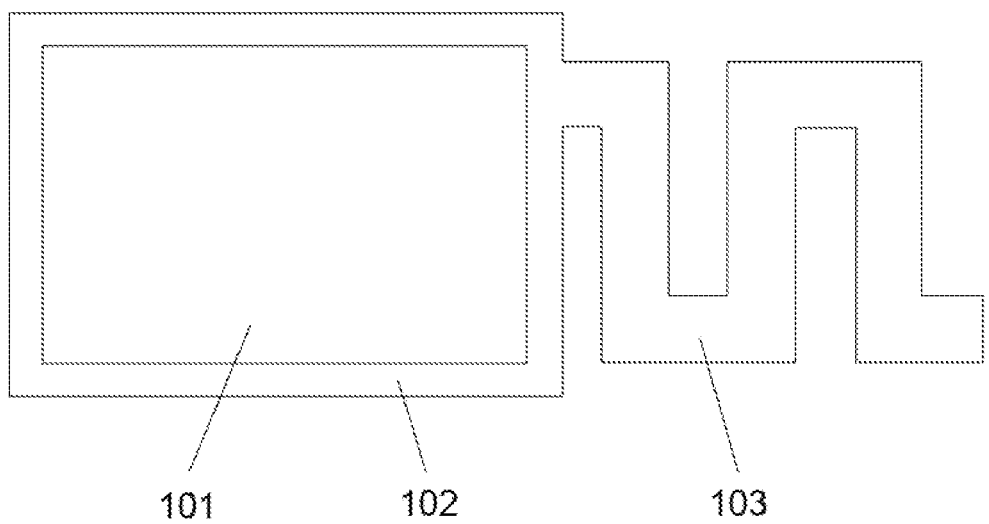
FIG. 2 is a top view of an RDL structure in another embodiment of the present disclosure.
Figure 3:
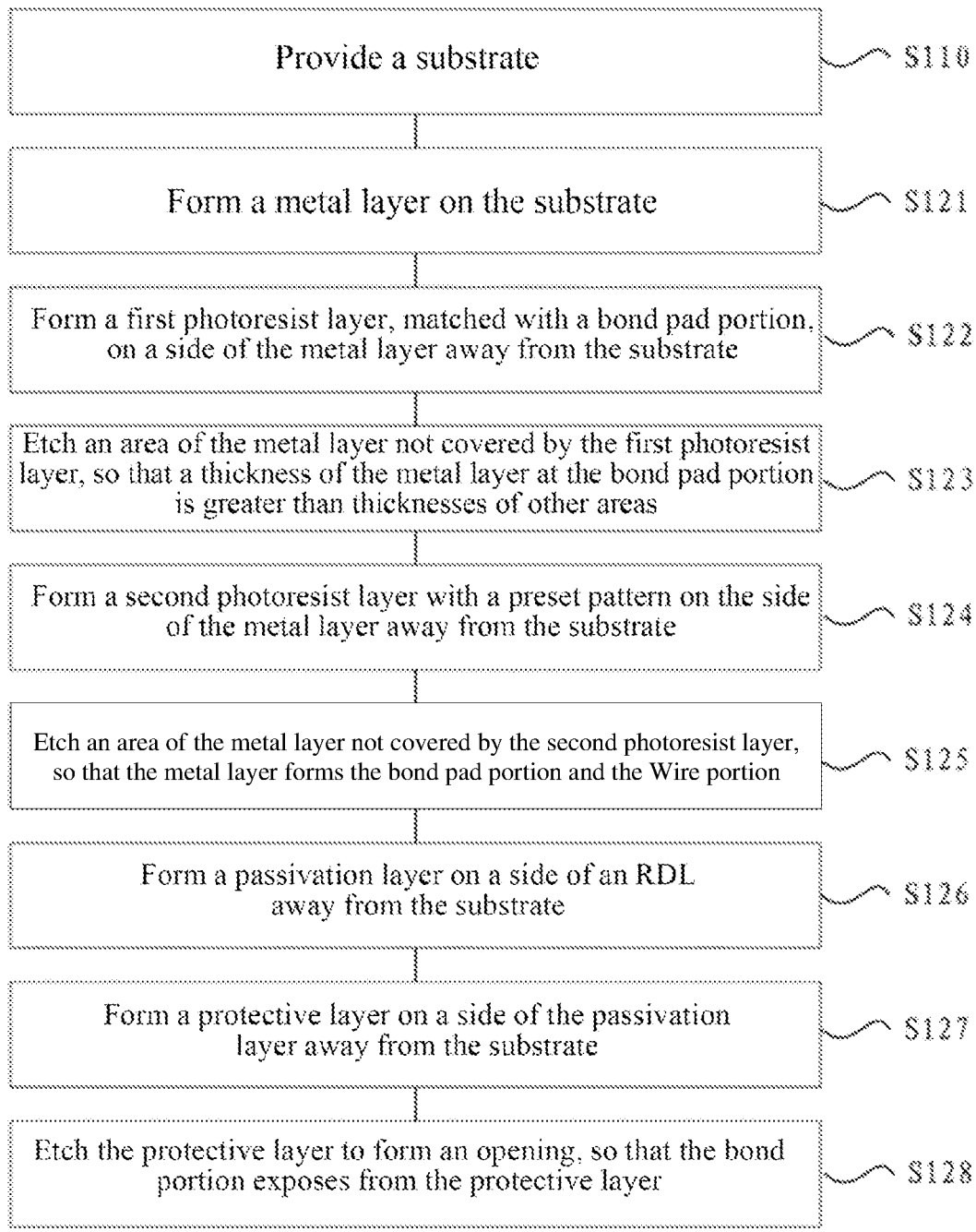
FIG. 3 is a flowchart of an RDL structure manufacturing method in an embodiment of the present disclosure.
Figure 7:
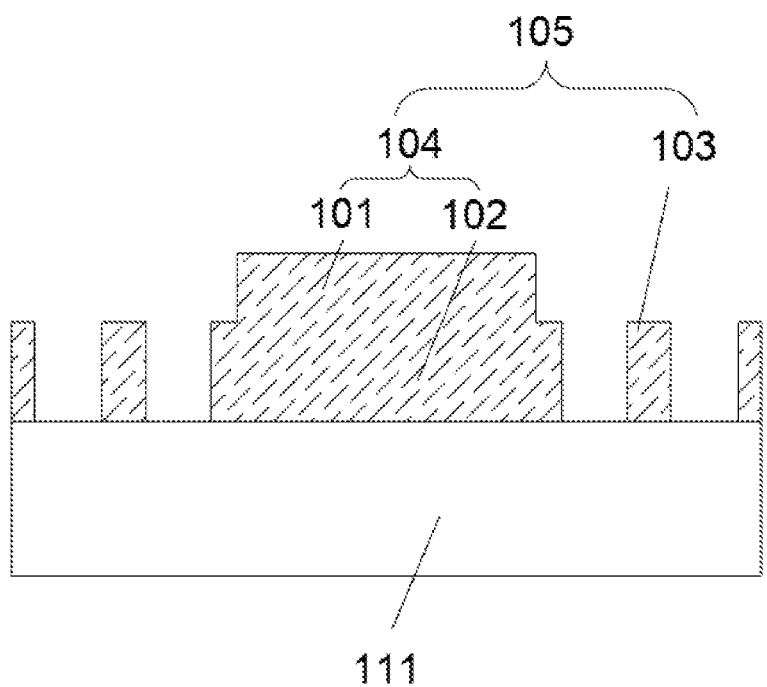
FIG. 7 is a cross-section view of an RDL structure upon the completion of step 125 in an embodiment of the present disclosure.

An embodiment of the present disclosure may disclose a wiring layer structure including an RDL structure. As shown in FIG. 1, FIG. 2, and FIG. 7, the RDL structure may include an RDL 105, disposed on a substrate 111. The RDL 105 may include a bond pad portion 104 and a wire portion 103 connected to the bond pad portion 104. The thickness of the bond pad portion 104 is greater than the thickness of the wire portion 103, and the bottoms of the bond pad portion 104 may be higher than, lower than, or aligned with the wire portion 103.

The RDL structure disclosed in the present disclosure prevents the problem of an increase of a parasitic capacitance between wires when the thickness of the RDL is increased. In the RDL structure disclosed by the present disclosure, a bond pad portion that is thicker than a wire portion can provide more impact buffer areas in gold or copper wire bonding of packaging, to avoid the situations that an insulating layer of a substrate cracks under stress, or a bottom metal wire of the bond pad portion deforms under stress to cause circuit short. The wire portion that is thinner than the bond pad portion may reduce a parasitic capacitance effect between wires, and improve the performance of the IC to meet a high-frequency working requirement.

Each part of the RDL structure in this embodiment of the present disclosure will be described below in detail in conjunction with the accompanying drawings.

The bond pad portion 104 includes a bond pad body portion 102 and a bond portion 101 disposed on a surface of the bond pad body portion 102 away from the substrate.

Further, the bond pad portion 104 formed by the bond pad body portion 102 and the bond portion 101 may form a step shape having a base platform wider than the top platform, such that a length and a width of an orthographic projection of the bond pad body portion 102 are greater than a length and a width of an orthographic projection of the bond portion 101. The bond portion 101 on the surface of the bond pad body portion 102 that is away from the substrate and under the bond portion 101 may form a step surface with a step height, such that the bond portion 101 and the bond pad body portion 102 forms the bond pad portion 104 in the step shape. Sidewalls of the bond portion 101 on the step surface may be covered by a photoresist to form a protection for the sidewalls of the bond portion 101. When the bond pad portion 104 and the wire portion 103 are formed by etching, the corrosion of an etchant to the sidewalls of the bond portion 101 can be prevented, and the wire portion 103 immediately adjacent to the bond pad portion 104 can be etched off completely to prevent undesired circuit short between the wire portion 103 and the bond pad portion 104. In the RDL structure provided by the present disclosure, the top surface of the bond pad body portion 102 facing away from the substrate may directly contact with the bottom surface of the bond portion 101 located on the bond pad body portion 102, without any medium layer or isolation layer therebetween. That is, the bond pad body portion 102 and the bond portion 101 are integrated as a single structure. In this way, the bond pad body portion 102 can provide an sufficient current for the bond portion 101 to prevent a signal transmission delay of the IC.

In an embodiment of the present disclosure, a preset distance is provided between side edges of the bond portion 101 and side edges of the bond pad body portion 102, so that an orthographic projection of the bond portion 101 on the bond pad body portion 102 is located within edges of the bond pad body portion 102. The preset distance is a width of the step surface, and may range from 0.5 µm to 3 µm. For example, the preset distance may be 1 µm, 1.5 µm, 2 µm, or 2.5 µm. The preset distance is based on a thickness of the photoresist covering of the sidewalls of the bond portion 101, and is not particularly limited in the present disclosure.

In an embodiment of the present disclosure, as shown in FIG. 1 and FIG. 7, the thickness of the wire portion 103 is the same as the thickness of the bond pad body portion 102, that is, the top surface of the wire portion 103 is flush with the step surface. In other embodiments of the present disclosure, the thickness of the wire portion 103 may be greater than or less than the thickness of the bond pad body portion 102, that is, the top surface of the wire portion 103 may be higher or lower than the step surface, which is not limited in the present disclosure.

In an embodiment of the present disclosure, the thickness of the bond pad portion 104 may range from 3 µm to 6 µm, and the thickness of the bond portion 101 may range from 1 µm to 2.5 µm. For example, the thickness of the bond pad portion 104 may be 3.5 µm, 4 µm, 4.5 µm, 5 µm, or 5.5 µm, and the thickness of the bond portion 101 may be 1.5 µm or 2 µm, which is not limited in the present disclosure.

In an embodiment of the present disclosure, the bond pad body portion 102 may be made of metal conductive materials, for example, any one of copper, aluminum, tungsten, and titanium, or alloys of the above materials. The bond pad body portion 102 may be formed by one layer of metal conductive materials, or by laminating multiple layers of different metal conductive materials, which is not limited in the present disclosure.

In an embodiment of the present disclosure, the bond portion 101 and the bond pad body portion 102 may be made of the same material, so that the bond portion 101 and the bond pad body portion 102 can be prepared in the same process, that is, the bond pad body portion 102 and the bond portion 101 are of an integral structure. In another embodiment of the present disclosure, the bond portion 101 and the bond pad body portion 102 may be made of different materials. The bond portion 101 may be formed by a layer of metal conductive materials, or by laminating multiple layers of different metal conductive materials, which is not limited in the present disclosure.

In an embodiment of the present disclosure, the wire portion 103 and the bond pad body portion 102 may be made of the same material, so that the wire portion 103 and the bond pad body portion 102 can be prepared in the same process. In another embodiment of the present disclosure, the wire portion 103 and the bond pad body portion 102 may be made of different materials, which is not limited in the present disclosure.

The orthographic projection of the bond portion 101 may be of a rectangular shape, a hexagonal shape, an octagonal shape, a circular shape, an oval shape, or other shapes prepared with a patterning process, as long as no impact to other components and the effective contacts with gold or copper bond balls in wire bonding of packaging are provided. The shapes of the bond pad body portion 102 and the bond portion 101 may be the same or different, as long as the distances between the edges of the orthographic projection of the bond pad body portion 102 and the edges of the orthographic projection of the bond portion 101 are within the preset distance. For example, the orthographic projection of the bond portion 101 is of the rectangular shape and the bond pad body portion 102 is of the rectangular shape too, or the orthographic projection of the bond portion 101 is of the rectangular shape and the orthographic projection of the bond pad body portion 102 is of the hexagonal shape, which is not limited in the present disclosure.

Cross-section views of the bond portion 101 and the bond pad body portion 102 may be of the rectangular shape, a trapezoidal shape, or the like. The cross-section views of the bond portion 101 and the bond pad body portion 102 may be the same or different.

In an embodiment of the present disclosure, as shown in FIG. 7, both cross-section views of the bond portion 101 and the bond pad body portion 102 are of the rectangular shape. The rectangular shaped bond portion 101 and bond pad body portion 102 may reduce the difficulty of the process to facilitate the manufacture.

Figure 11:
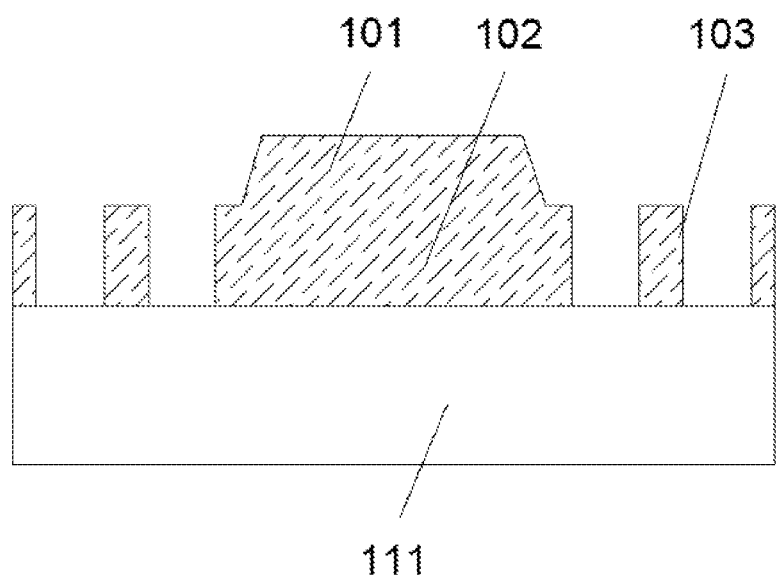
FIG. 11 is a cross-section view of an RDL structure in an embodiment of the present disclosure.

In another embodiment of the present disclosure, as shown in FIG. 11, the cross-section view of the bond portion 101 may be of a trapezoidal shape including a top, a bottom, and sidewalls. The sidewalls connect the top and the bottom. The top is a surface facing away from the substrate, and an area of the top is smaller than an area of the bottom. The cross-section view of the bond pad body portion 102 may be of the rectangular shape, and the bottom of the bond portion 101 is connected to the bond pad body portion 102. The trapezoidal shaped bond portion 101 may improve the supporting capability of the bond portion 101, and reduce the impact damage of the gold or copper bond balls to the bond portion 101 in the wire bonding of packaging.

Figure 12:
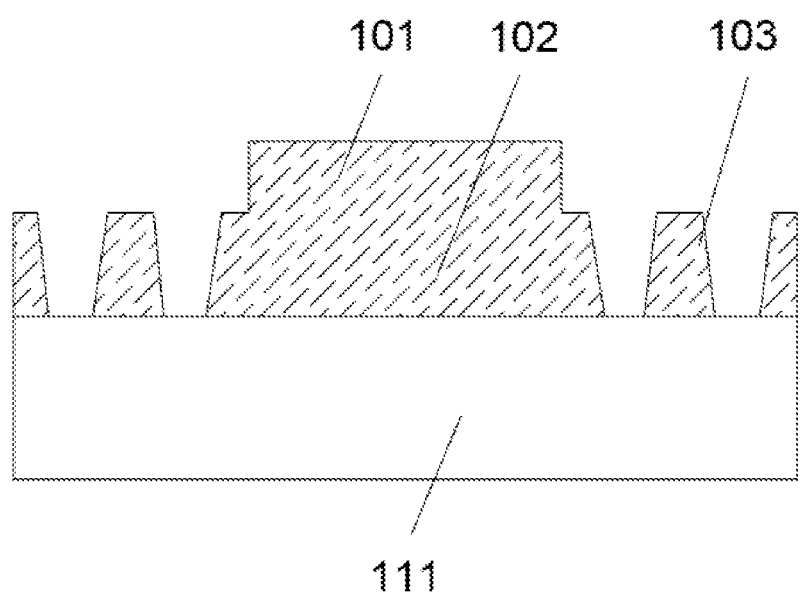
FIG. 12 is a cross-section view of an RDL structure in an embodiment of the present disclosure.

In another embodiment of the present disclosure, as shown in FIG. 12, the cross-section view of the bond pad body portion 102 may be of the trapezoidal shape including a top, a bottom and sidewalls. The sidewalls connect the top and the bottom, the top is a surface facing away from the substrate, and an area of the top is smaller than an area of the bottom. The cross-section view of the bond portion 101 may be of the rectangular shape, and the bond portion 101 is connected to the top of the bond pad body portion 102. The trapezoidal shaped bond pad body portion 102 may improve the supporting capability of the bond pad body portion 102 to the bond portion 101, and reduce the impact damage of the gold or copper bond balls to the bond portion 101 and the bond pad body portion 102 in the wire bonding of packaging.

Figure 9:
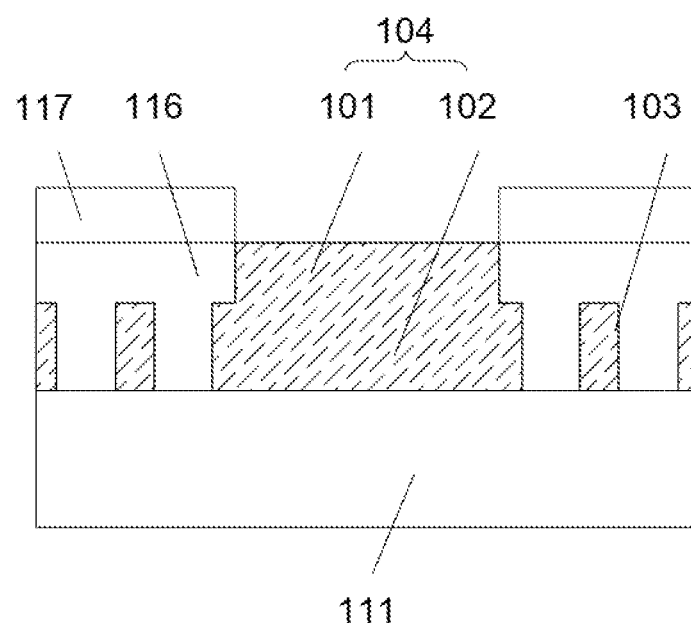
FIG. 9 is a cross-section view of an RDL structure upon the completion of a step 128 of a manufacturing method provided by an embodiment of the present disclosure.

In an embodiment of the present disclosure, the RDL structure may further include a passivation layer and a protective layer. As shown in FIG. 9, the passivation layer 116 is disposed on sides of the RDL 105 facing away from the substrate 111, and is flush with the top surface of the bond pad portion 104 facing away from the substrate 111. In another embodiment, the top of the passivation layer 116 may be lower or higher than the top surface of the bond pad portion 104. The passivation layer 116 may be made of a dielectric material. The material of the passivation layer 116 may be one of silicon oxide, silicon nitride, or silicon oxynitride, or a combination thereof. It may be understood that the passivation layer may be formed by a layer of dielectric materials, and may also be formed by laminating multiple layers of dielectric materials, which is not limited thereto in the present disclosure. Further, the protective layer 117 is disposed on a surface of the passivation layer 116 facing away from the substrate 111 to form a protection for the passivation layer 116 thereunder. In an embodiment of the present disclosure, the protective layer 117 may be made of polyimide. An opening is provided on the protective layer 117, so that the bond portion 101 can expose from the protective layer 117 and or the passivation layer 116. The top surface of the protective layer 117 facing away from the substrate 111 may be higher than the top surface of the bond portion 101 facing away from the substrate 111.

Figure 10:
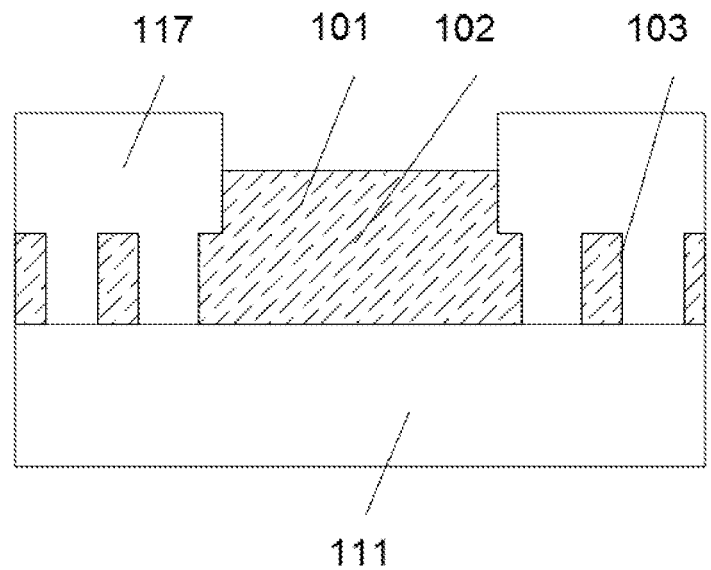
FIG. 10 is a cross-section view of an RDL structure upon the completion of step 127' in an embodiment of the present disclosure.

In another embodiment of the present disclosure, the RDL structure may further include a protective layer. As shown in FIG. 10, the protective layer 117 is formed on sides of the RDL 105 facing away from the substrate 111, and an opening is provided on the protective layer 117, so that the bond portion 101 can expose from the protective layer 117. The top surface of the protective layer 117 facing away from the substrate 111 is protruded out of the top surface of the bond portion 101 facing away from the substrate 111. In an embodiment of the present disclosure, the protective layer may be made of polyimide.

In the RDL structure provided by the present disclosure, a bond portion 101 and a bond pad body portion 102 may be formed in other shapes, which is not limited thereto in the present disclosure. Any change relating to the shapes of the bond portion 101 and the bond pad body portion 102 falls into a protection scope of the present disclosure.

An embodiment of the present disclosure further provides a manufacturing method of an RDL structure, including the following steps.

In Step S110, a substrate is provided.

In Step S120, an RDL is formed on the substrate, and the RDL may include a bond pad portion and a wire portion connected to the bond pad portion.

A thickness of the bond pad portion may be greater than a thickness of the wire portion.

According to the manufacturing method of the RDL structure provided by the present disclosure, the RDL structure may prevent the problem of an increase in a parasitic capacitance between wires when a thickness of an RDL is increased. A thicker bond pad portion than a wire portion can provide more impact buffer areas for gold or copper wire bonding of packaging, to prevent an insulating layer of a substrate to be cracked under stress or a circuit short caused by a deformed bottom metal wire under stress. In addition, the thinner wire portion than the bond pad portion may reduce a parasitic capacitance effect between wires, and improve the performance of an IC to meet a high-frequency working requirement.

The manufacturing method of the RDL structure in this embodiment of the present disclosure is described below in detail in conjunction with FIG. 3 to FIG. 10.

In Step S110, a substrate is provided.

In an embodiment of the present disclosure, the substrate 111 may be a silicon substrate such as a silicon epitaxial wafer or a silicon on insulator, and may also be a substrate made of semiconductor materials such as GaN. The substrate 111 may be an undoped intrinsic semiconductor substrate, or an N-type doped or P-type doped semiconductor substrate. Moreover, the substrate 111 may include one or more of a dielectric layer, an insulating layer, or a passivation layer, which is not limited thereto in the present disclosure.

In Step S120, an RDL is formed on the substrate.

The Step S120 may include the following steps.

In Step S121, a metal layer is formed on the substrate.

Figure 4:
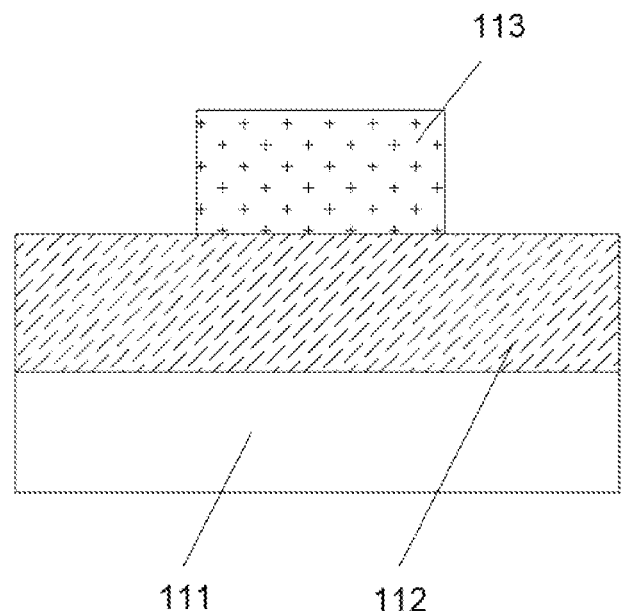
FIG. 4 is a cross-section view of an RDL structure upon the completion of step 122 in an embodiment of the present disclosure.

As shown in FIG. 4, the metal layer 112 having a preset thickness may be formed on the substrate 111 via physical vapor deposition, electro-plating, or other manners, and the thickness of the metal layer 112 may range from 3 μm to 6 μm. The metal layer 112 is made of conductive materials. For example, the metal layer may be made of any one of copper, aluminum, tungsten, and titanium, or alloys of the above materials, which is not limited thereto in the present disclosure.

In Step S122, a first photoresist layer matched with the bond pad portion is formed on the top surface of the metal layer facing away from the substrate.

As shown in FIG. 4, the first photoresist layer 113 is formed on the top surface of the metal layer 112 facing away from the substrate 111 via a spraying manner.

In Step S123, an area of the metal layer 112 not covered by the first photoresist layer 113 may be etched off, so that a thickness of the metal layer at the bond portion is greater than thicknesses of other areas.

Figure 5:
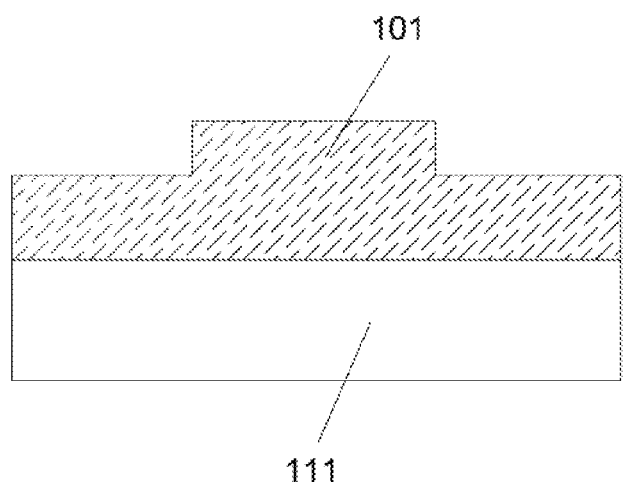
FIG. 5 is a cross-section view of an RDL structure upon the completion of step 123 in an embodiment of the present disclosure.

As shown in FIG. 5, the area of the metal layer 112 not covered by the first photoresist layer 113 is exposed and developed, and then etched via a manner such as wet etching, dry etching, or plasma etching, to reduce the thickness of the exposed area on the metal layer 112. In an embodiment of the present disclosure, the thickness of the metal layer 112 may range from 3 μm to 6 μm, and the thickness of the thinned area may range from 2 μm to 5 μm. For example, the thickness of the metal layer is 3.5 μm, 4 μm, 4.5 μm, 5 μm, or 5.5 μm, and the thickness of the thinned area is 2.5 μm, 3 μm or 3.5 μm, 4 μm, or 4.5 μm.

In Step S124, a second photoresist layer with a preset pattern may be formed on the surfaces of the metal layer facing away from the substrate and the sidewalls of the metal layer.

Figure 6:
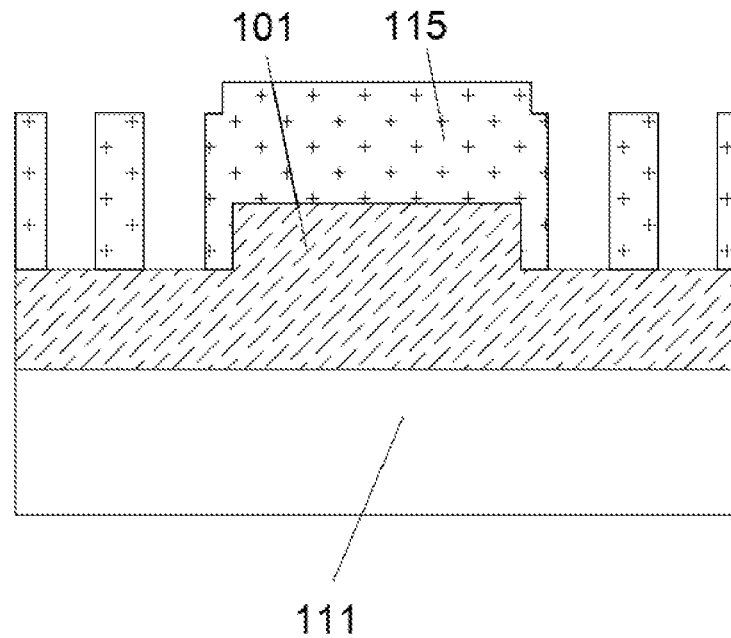
FIG. 6 is a cross-section view of an RDL structure upon the completion of step 124 in an embodiment of the present disclosure.

As shown in FIG. 6, the second photoresist layer 115 may be formed on the metal layer 112 via a spraying manner.

Sidewalls of the bond portion 101 on the step surface is covered by the second photoresist 115 to form a protection for the sidewalls of the bond portion 101. When the bond pad portion and the wire portion are formed by etching, the corrosion of an etchant to the sidewalls of the bond portion 101 can be prevented, and the wire portion 103 immediately adjacent to the bond pad portion 104 can be etched completely to prevent the circuit short between the wire portion 103 and the bond pad portion 104.

In Step S125, an area of the metal layer not covered by the second photoresist layer may be etched off, to form the bond pad portion and the wire portion from the metal layer.

The portion of the metal layer 112 not covered by the second photoresist layer 115 is etched to form the metal layer to the shape shown in FIG. 7, so that the bond portion 101, the bond pad body portion 102, and the wire portion 103 may be formed from the metal layer 112.

In an embodiment of the present disclosure, a preset distance is provided between side edges of the bond portion 101 and side edges of the bond pad body portion 102, so that an orthographic projection of the bond portion 101 on the bond pad body portion 102 is located within edges of the bond pad body portion 102. The preset distance may be the distance between each side edge of the bond portion 101 and the adjacent side edge of the bond pad body portion 102 and may range from 0.5 μm to 3 μm. For example, the preset distance may be 1 μm, 1.5 μm, 2 μm, or 2.5 μm.

In an embodiment of the present disclosure, the thickness of the bond portion 101 may range from 1 μm to 2.5 μm. For example, the thickness of the bond portion 101 may be 1.5 μm or 2 μm.

In an embodiment of the present disclosure, the manufacturing method of the RDL structure further includes the following steps.

In Step S126, a passivation layer may be formed on surfaces of the RDL facing away from the substrate.

Figure 8:
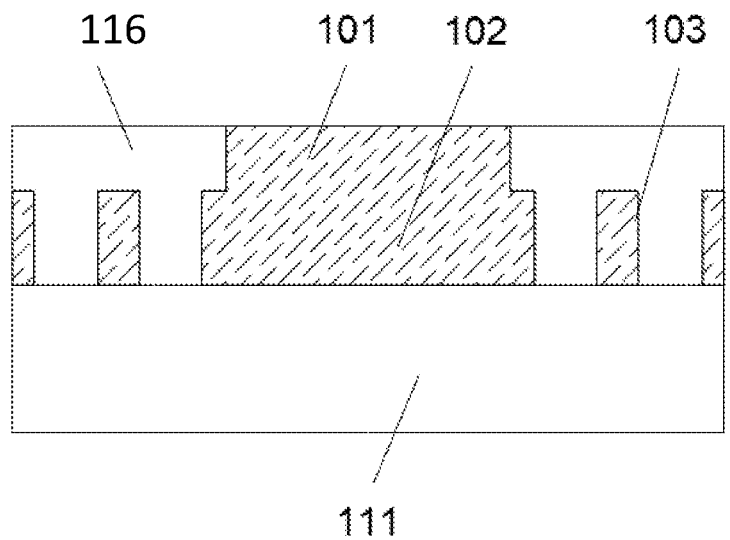
FIG. 8 is a cross-section view of an RDL structure upon the completion of a step 126 of a manufacturing method provided by an embodiment of the present disclosure.

As shown in FIG. 8, the top of the passivation layer 116 may be flush with a surface of the bond pad portion facing away from the substrate 111. Certainly, the top of the passivation layer 116 may be higher or lower than the top of the bond portion 104. The passivation layer may be made of dielectric materials. The material of the passivation layer may be one of silicon oxide, silicon nitride, or silicon oxynitride, or a combination thereof. It may be understood that the passivation layer may be formed by a layer of dielectric materials, or may also be formed by laminating multiple layers of dielectric materials, which is not limited thereto in the present disclosure.

In Step S127, a protective layer may be formed on a surface of the passivation layer facing away from the substrate.

The protective layer 117 may be formed on the surface of the passivation layer 116 facing away from the substrate 111 to form a protection for the passivation layer thereunder. In an embodiment of the present disclosure, the protective layer may be made of polyimide.

In Step S128, the protective layer may be etched to form an opening, so that the bond portion 101 exposes from the protective layer.

As shown in FIG. 9, the opening may be formed by applying, masking, exposing, etching, and other processes to a photoresist layer, so that the bond portion 101 may expose from the protective layer 117 and/or the passivation layer 116. In an embodiment of the present disclosure, the top surface of the protective layer 117 facing away from the substrate 111 is protruded out of the surface of the bond portion 101 facing away from the substrate 111.

In another embodiment of the present disclosure, the manufacturing method of the RDL structure may further include the following steps.

Alternatively, in Step S126', a protective layer may be formed on a surface of the RDL away from the substrate.

The protective layer 117 may be directly formed on the surface of the RDL away from the substrate 111 to form a protection for the RDL. In an embodiment of the present disclosure, the protective layer may be made of polyimide.

In Step S127', the protective layer is etched to form an opening, so that the bond portion 101 exposes from the protective layer.

As shown in FIG. 10, the opening may be formed by applying, masking, exposing, etching, and other processes to a photoresist layer, so that the bond portion 101 exposes from the protective layer 117. In an embodiment of the present disclosure, the top surface of the protective layer 117 facing away from the substrate 111 is protruded out of the surface of the bond portion 101 facing away from the substrate 111.

An embodiment of the present disclosure further provides a semiconductor structure. The semiconductor structure includes the RDL structure provided by the above embodiments. It should be understood by the person skilled in the art that the semiconductor structure has the same technical effects of the above RDL structure. The semiconductor structure may be an IC chip, a memory, a processor, or other ICs including the said semiconductor structure.

While the embodiments of the present invention are described in connection with an RDL structure including an RDL, they are equally applicable to a wiring layer (WL) structure including a wiring layer having the same components.

Other embodiments of the present disclosure will be apparent to the person skilled in the art from consideration of the specification and practice of the present disclosure disclosed here. The present disclosure covers any variations, uses, or adaptations of the present disclosure following the general principles of the present disclosure and including common knowledge or conventional practice in the art undisclosed in the present disclosure. The specification and embodiment are considered as being exemplary only. The true scope and spirit of the present disclosure are indicated by the appended claims.

What is claimed is:

1. A wiring layer (WL) structure, comprising:
a WL, disposed on a substrate and comprising a bond pad portion and a wire portion connected to the bond pad portion,
wherein a thickness of the bond pad portion is greater than a thickness of the wire portion,
wherein the bond pad portion is of a step shape and comprises a bond pad body portion and a bond portion disposed on a surface of the bond pad body portion facing away from the substrate, and
wherein a length and a width of the bond pad body portion are greater than a length and a width of an orthographic projection of the bond portion on the bond pad body portion respectively.

2. The WL structure according to claim 1, wherein a preset distance is provided between side edges of the bond portion and side edges of the bond pad body portion, and the preset distance ranges from 0.5 μm to 3 μm.

3. The WL structure according to claim 1, wherein a bottom of the bond pad portion is aligned or unaligned with a bottom of the wire portion.

4. The WL structure according to claim 1, wherein the thickness of the wire portion is the same as the thickness of the bond pad body portion.

5. The WL structure according to claim 1, wherein a thickness difference between the bond pad portion and the wire portion ranges from 1 μm to 2.5 μm.

6. The WL structure according to claim 1, wherein the orthographic projection of the bond portion and an orthographic projection of the bond pad body portion are of a rectangular shape, a hexagonal shape, an octagonal shape, a circular shape, or an oval shape,
and wherein the shapes of the orthographic projection of the bond pad body portion and the orthographic projection of the bond portion are the same or different.

7. The WL structure according to claim 1, wherein a cross-section view of the bond portion and a cross-section view of the bond pad body portion are of a rectangular shape or a trapezoidal shape,
and wherein the shapes of the cross-section view of the bond portion and the cross-section view of the bond pad body portion are the same or different.

8. The WL structure according to claim 7, wherein each of the trapezoidal shaped cross-section view of the bond portion and the trapezoidal shaped cross-section view of the bond pad body portion comprise a top and a bottom, wherein the top is a surface facing away from the substrate, and an area of the top is smaller than an area of the bottom.

9. The WL structure according to claim 7, wherein an area of a bottom of the bond portion is smaller than an area of a top of the bond pad body portion.

10. The WL structure according to claim 1, wherein the bond portion and the bond pad body portion are made of a same material, and the bond portion and the bond pad body portion are of an integral structure.

11. The WL structure according to claim 1, wherein the wire portion and the bond pad body portion are made of a same material, and the wire portion and the bond pad body portion are of an integral structure.

12. The WL structure according to claim 1, further comprising:
a passivation layer, disposed on surfaces of the WL facing away from the substrate; and
a protective layer, disposed on a surface of the passivation layer facing away from the substrate,
wherein the protective layer has an opening to expose a top surface of the bond portion,
and wherein a top surface of the protective layer is protruded out of the top surface of the bond portion.

13. The WL structure according to claim 1, further comprising:
a protective layer, disposed on surfaces of the WL facing away from the substrate,
wherein the protective layer has an opening to expose a top surface of the bond portion,
and wherein a top surface of the protective layer is protruded out of the top surface of the bond portion.

14. The WL structure according to claim 1, wherein the WL comprises a redistribution layer (RDL), and the WL structure comprises the RDL structure.

15. A manufacturing method of a wiring layer (WL) structure, comprising:
providing a substrate; and
forming an WL on the substrate, the WL comprising a bond pad portion and a wire portion connected to the bond pad portion,
wherein a thickness of the bond pad portion is greater than a thickness of the wire portion,
wherein the bond pad portion is of a step shape and comprises a bond pad body portion and a bond portion disposed on a surface of the bond pad body portion facing away from the substrate, and
wherein a length and a width of the bond pad body portion are greater than a length and a width of an orthographic projection of the bond portion on the bond pad body portion respectively.

16. The manufacturing method of the WL structure according to claim 15, wherein forming the WL on the substrate comprises:
forming a metal layer on the substrate;
forming a first photoresist layer, matched with the bond pad portion, on a surface of the metal layer facing away from the substrate;
etching an area of the metal layer not covered by the first photoresist layer, wherein a thickness of the metal layer at the bond pad portion is greater than thicknesses of other areas;
forming a second photoresist layer with a preset pattern on the surface of the metal layer facing away from the substrate; and
etching an area of the metal layer not covered by the second photoresist layer, wherein the bond pad portion and the wire portion are formed from the metal layer.

17. The manufacturing method of the WL structure according to claim 15, further comprising:
forming a passivation layer on surfaces of the WL facing away from the substrate;
forming a protective layer on a top surface of the passivation layer; and
etching the protective layer to expose the bond portion from the protective layer.

18. The manufacturing method of the WL structure according to claim 15, further comprising:
forming a protective layer on surfaces of the WL facing away from the substrate; and
etching the protective layer to expose the bond portion from the protective layer.

19. The manufacturing method of the WL structure according to claim 15, wherein the WL comprises a redistribution layer (RDL), and the WL structure comprises the RDL structure.

20. A semiconductor structure, comprising a wiring layer (WL) structure, wherein the WL structure comprises:
   a WL, disposed on a substrate and comprising a bond pad portion and a wire portion connected to the bond pad portion,
   wherein a thickness of the bond pad portion is greater than a thickness of the wire portion,
   wherein the bond pad portion is of a step shape and comprises a bond pad body portion and a bond portion disposed on a surface of the bond pad body portion facing away from the substrate, and
   wherein a length and a width of the bond pad body portion are greater than a length and a width of an orthographic projection of the bond portion on the bond pad body portion respectively.

21. The semiconductor structure of claim 20, wherein the WL comprises a redistribution layer (RDL), and the WL structure comprises the RDL structure.

* * * * *